(12) United States Patent
Short et al.

(10) Patent No.: US 11,311,982 B2
(45) Date of Patent: Apr. 26, 2022

(54) SUPPORT FOR FLEXIBLE WORKPIECES

(71) Applicant: ASM Assembly Systems Singapore Pte. Ltd., Singapore (SG)

(72) Inventors: Neil Short, Weymouth (GB); Paddy Ash, Weymouth (GB)

(73) Assignee: ASM ASSEMBLY SYSTEMS SINGAPORE PTE. LTD., Singapore (SG)

(*) Notice: Subject to any disclaimer, the term of this patent is extended or adjusted under 35 U.S.C. 154(b) by 199 days.

(21) Appl. No.: 15/874,258

(22) Filed: Jan. 18, 2018

(65) Prior Publication Data
US 2018/0236639 A1    Aug. 23, 2018

(30) Foreign Application Priority Data
Feb. 23, 2017 (GB) ....................... 1702916

(51) Int. Cl.
*B25B 11/00* (2006.01)
*H01L 21/683* (2006.01)
*H01L 21/687* (2006.01)

(52) U.S. Cl.
CPC ........ *B25B 11/005* (2013.01); *H01L 21/6838* (2013.01); *H01L 21/68721* (2013.01); *H01L 21/68778* (2013.01); *H01L 21/68785* (2013.01)

(58) Field of Classification Search
CPC . B25B 11/005; B25B 11/007; H01L 21/6838; H01L 21/68721; H01L 21/68778; H01L 21/68771; H01L 21/68785; B23Q 3/00; B23Q 3/02; B23Q 3/06; B23Q 3/08; B23Q 3/088; B23Q 2703/00; B23Q 2703/04
See application file for complete search history.

(56) References Cited

U.S. PATENT DOCUMENTS

| 3,413,903 | A | * | 12/1968 | Maldarelli | ............... | G03B 1/18 |
| | | | | | | 396/441 |
| 5,505,124 | A | | 4/1996 | Esposito | ........................ | 101/142 |
| 6,189,876 | B1 | | 2/2001 | Frazier | ............................. | 269/21 |
| 2003/0074788 | A1 | * | 4/2003 | Gordon | .............. | H05K 13/0069 |
| | | | | | | 29/832 |
| 2009/0127760 | A1 | * | 5/2009 | Wang | .................... | B25B 11/005 |
| | | | | | | 269/21 |
| 2018/0247845 | A1 | * | 8/2018 | Rasch | ............... | H01L 21/67333 |

FOREIGN PATENT DOCUMENTS

| EP | 1403014 A1 | 3/2004 |
| JP | S61-61131 U | 4/1986 |
| JP | H0584682 A | 4/1993 |
| JP | 2012-176852 A | 9/2012 |
| WO | WO 2013/074954 A1 | 5/2013 |
| WO | WO 2017/044627 A1 | 3/2017 |

\* cited by examiner

*Primary Examiner* — Tyrone V Hall, Jr.
*Assistant Examiner* — Abbie E Quann
(74) *Attorney, Agent, or Firm* — Ostrolenk Faber LLP

(57) ABSTRACT

Clamping of edges of flexible workpieces to a support surface is improved by creating a region of reduced pressure proximate the edges, by shaping air conduits so that they narrow in the edge regions.

17 Claims, 7 Drawing Sheets

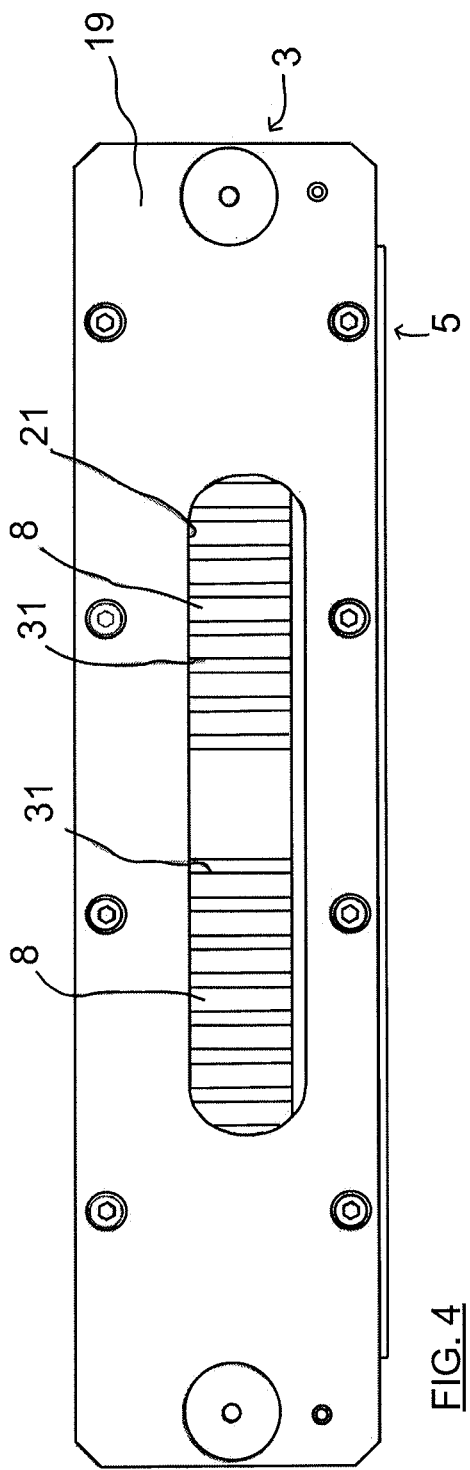
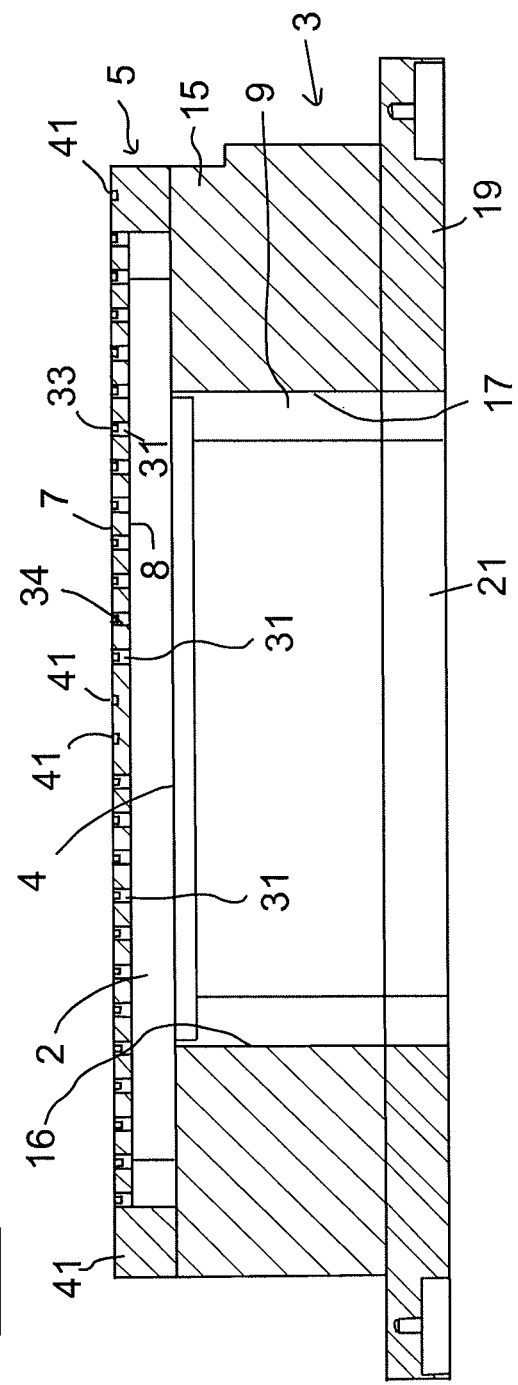
FIG. 4
FIG. 5

SUPPORT FOR FLEXIBLE WORKPIECES

CROSS-REFERENCE TO RELATED APPLICATION

The present application claims priority to United Kingdom Patent Application No. 1702916.6, filed Feb. 23, 2017, the content of which is incorporated herein by reference.

The present invention relates to a support member and tooling support for flexible workpieces, especially flexible electronics substrates, such as flexible strips.

BACKGROUND AND PRIOR ART

Vacuum clamping of workpieces, such as electronics substrates, is well known per se. Such clamping enables operations, such as screen printing, to be carried out on the workpiece while preventing movement thereof.

While such standard tooling works well for rigid workpieces, it has been found that it is less successful for supporting flexible workpieces. In particular, such standard tooling may suffer from the problem that edges of flexible workpieces might not be sufficiently clamped, such that they lift up from the support surface. However, simply applying a lower pressure/greater vacuum to the tooling is not a preferred solution, due to the increased cost and inefficiency involved.

It is an aim of the present invention to overcome this problem.

SUMMARY OF THE INVENTION

In accordance with the present invention, the above aim is achieved by providing a support member configured such that a region of enhanced low pressure is created in a region proximate the edges of the clamping zone, such that the edges of a workpiece are subjected to this lower pressure, and thus clamped more tightly in position, while the central remainder of the workpiece is held at a higher, more standard pressure.

In one aspect the present invention provides a support member for supporting flexible workpieces, the support member comprising:
a substantially planar support surface having a planar clamping zone to which a workpiece is securable by a reduced pressure or vacuum in use,
an internal cavity formed within the support member,
a port for connection to a low pressure or vacuum source, the port being in fluid connection with the internal cavity,
a recess formed in the support surface in fluid connection with the internal cavity, said recess laterally extending along the support surface such that the recess has an outer region located proximate a periphery of the clamping zone and an inner region located within a central portion of the clamping zone, the inner and outer regions having respective widths, w1 and w2, parallel to the plane of the support surface, wherein the width (w2) of the outer region of the recess is narrower than the width (w1) of the inner region, such that in use, when the port is fluidly connected to a low pressure or vacuum source, pressure at the periphery of the clamping zone is lower than at the central portion within the clamping zone.

With this configuration, the present invention advantageously confers improved planarity to flexible substrates, especially at the edge regions thereof.

In accordance with a second aspect of the present invention there is provided a tooling support for supporting flexible workpieces, comprising a support member according to the first aspect.

Various preferred features of the present invention are set out in the accompanying dependent claims.

BRIEF DESCRIPTION OF THE DRAWINGS

Preferred embodiments of the present invention will now be described with reference to the accompanying drawings, in which:

FIG. 4 illustrates a bottom view of the tooling support of FIG. 1;

FIG. 5 illustrates a longitudinal sectional view (along section I-I in FIG. 1) of the tooling support of FIG. 1;

DETAILED DESCRIPTION OF THE PREFERRED EMBODIMENTS OF THE INVENTION

Figure 1:
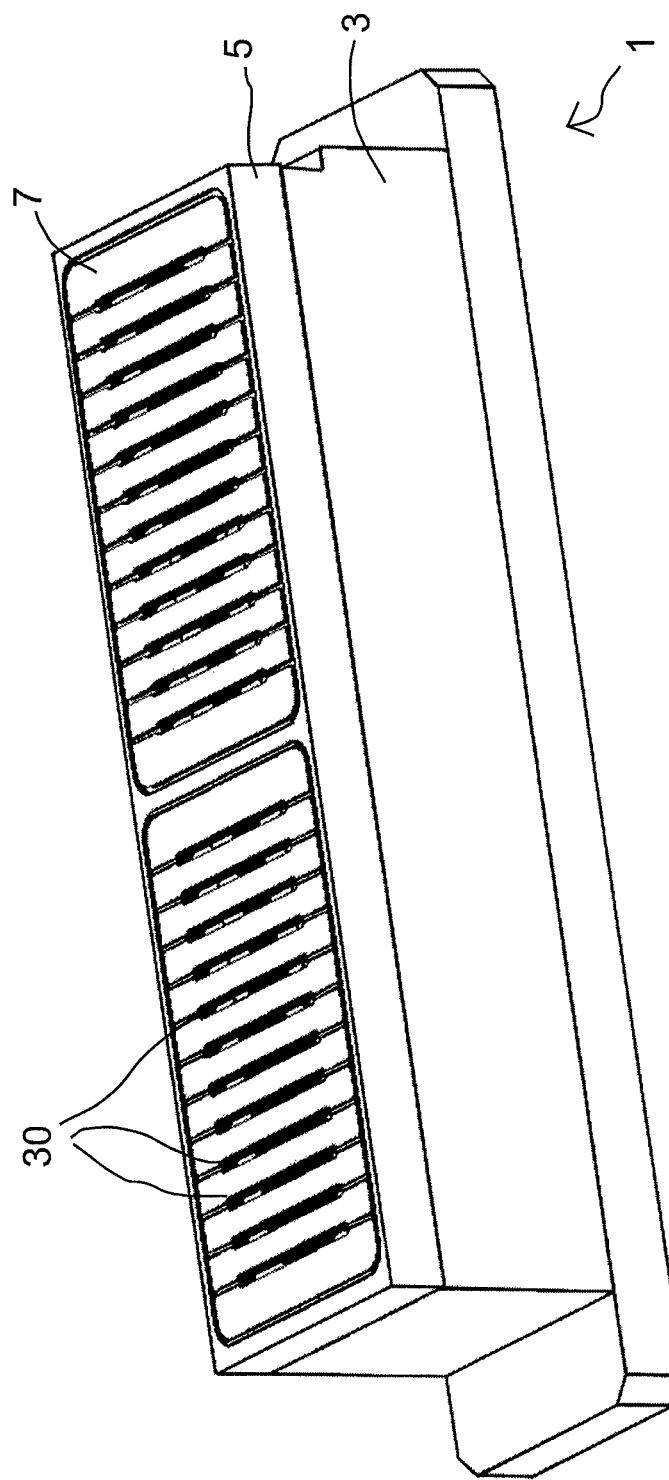
FIG. 1 illustrates a perspective view of a tooling support in accordance with a first embodiment of the present invention.
Figure 2:
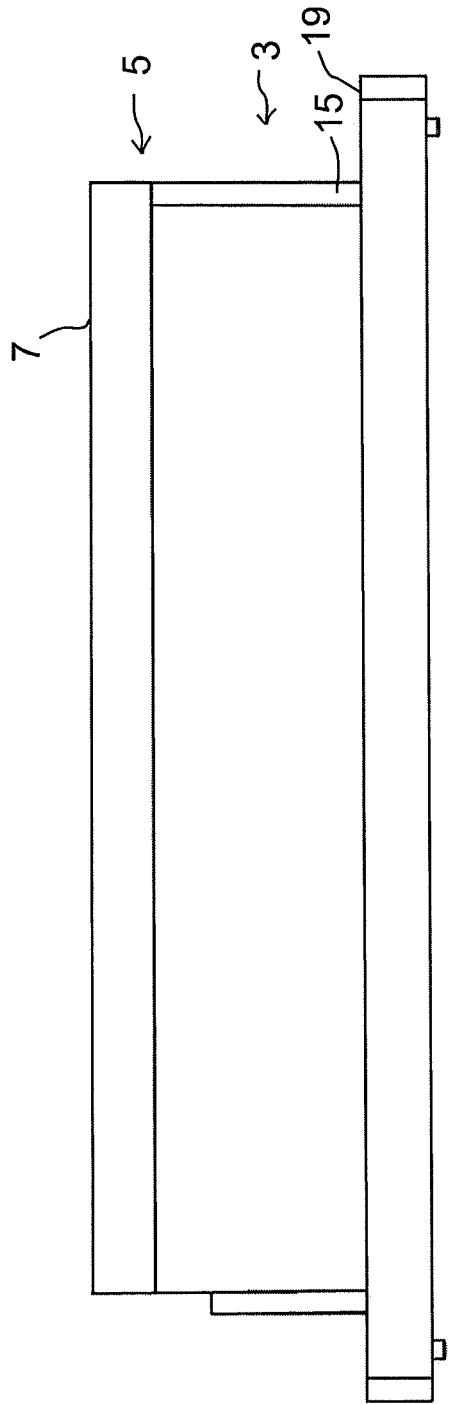
FIG. 2 illustrates a side view of the tooling support of FIG. 1.
Figure 3:
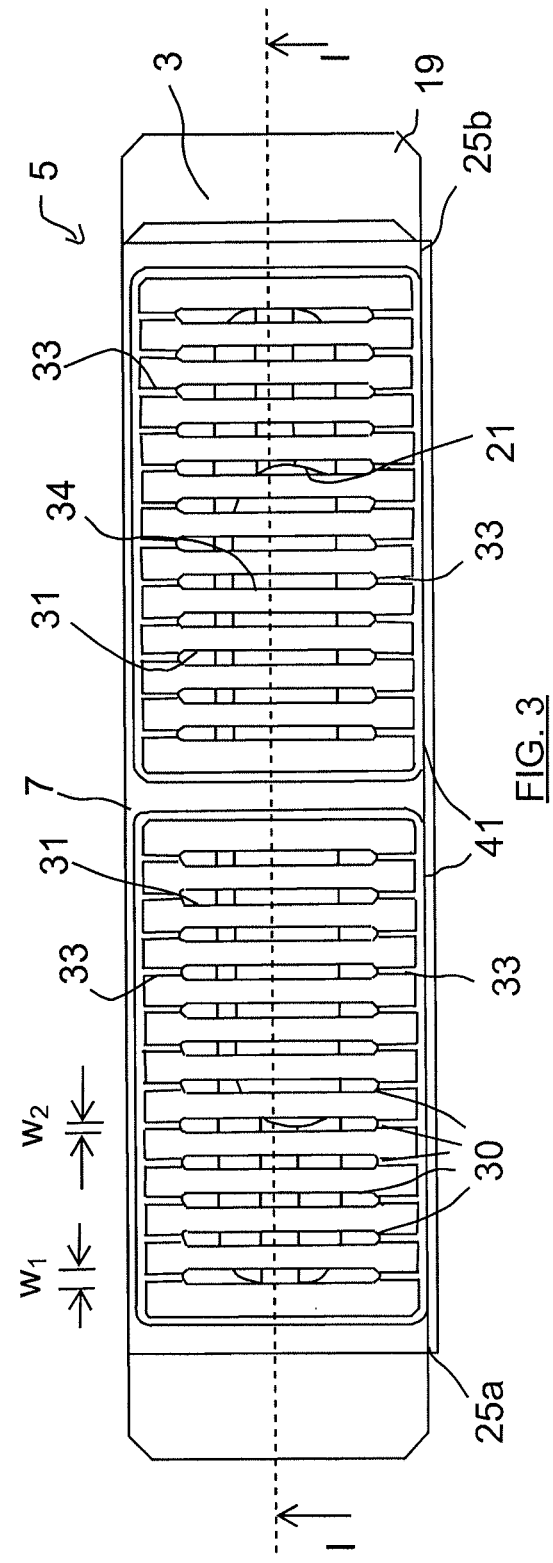
FIG. 3 illustrates a plan view of the tooling support of FIG. 1.
Figure 6:
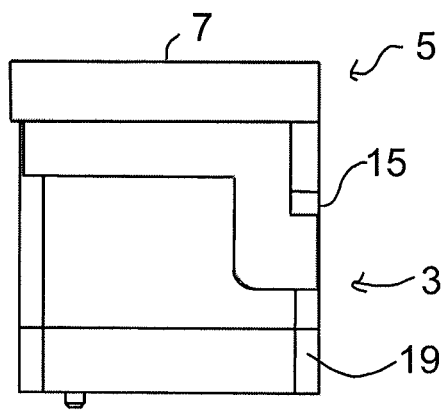
FIG. 6 illustrates one end view of the tooling support of FIG. 1.
Figure 7:
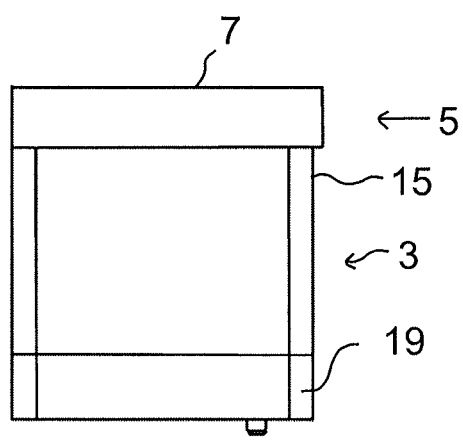
FIG. 7 illustrates the other end view of the tooling support of FIG. 1.
Figure 8:
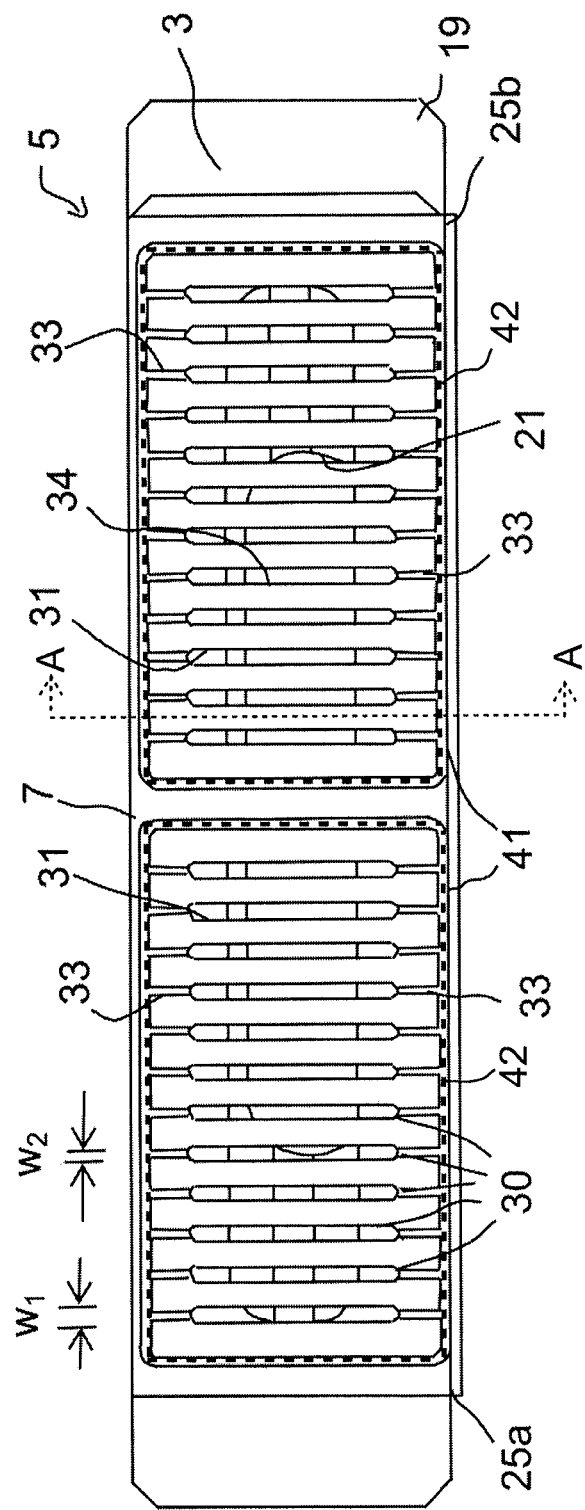
FIG. 8 schematically shows a plan view of a tooling support in accordance with a second embodiment of the present invention.
Figure 9:
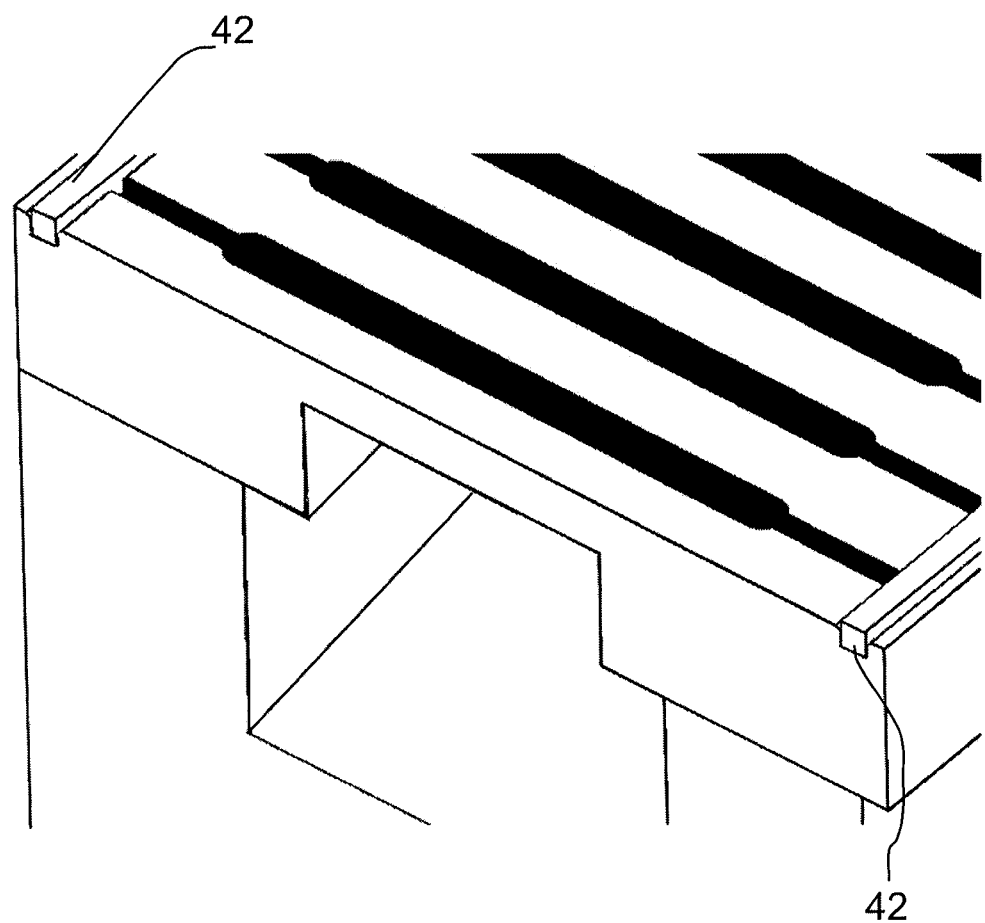
FIG. 9 schematically shows a perspective sectional view of the tooling support of FIG. 8 taken along the line A-A.

FIGS. 1 to 7 illustrate a perspective view of a tooling support 1 in accordance with a first embodiment of the present invention for supporting flexible workpieces, especially flexible electronics substrates, such as flexible strips. The flexibility of the strips may vary widely, from very flexible and incapable of self-support, to nearly rigid but prone to flexing under applied force.

The tooling support 1 comprises a body 3, in this embodiment an elongate body, and a support member 5. Support member 5 is formed as a block including a first, substantially planar support surface 7, in this embodiment an upper surface, on which at least one workpiece WP is clamped in use by an applied vacuum or reduced pressure, an underside 8 (see FIG. 4, 5) of support surface 7, and an internal cavity 2 formed within the support member 5 below underside 8. The lower surface of the support member 5 includes a port 4 in fluid connection with the internal cavity 2.

A suitable material for the support member 5 is aluminium (Al) for example, as will be understood in the art. In this embodiment the body 3 and the support member 5 are formed as separate parts, but could be integrally formed.

In this embodiment the body 3 includes a chamber 9, here an elongate chamber, which is fluidly connected to the internal cavity 2 of the support member 5.

In this embodiment the body 3 comprises a hollow main body member 15 with at least partially open upper and lower surfaces, whose internal side walls 16, 17 in part define the chamber 9, and a base member 19 which is coupled to the main body member 15 and includes a port 21 which is fluidly connected to the chamber 9, and to which a low pressure or vacuum source is selectively applied during use.

The support member 5 includes at least one clamping zone 25 co-planar with support surface 7. In this embodiment two clamping zones 25a, b, are provided, to which one or more workpieces W are in use clamped for processing, such as for a screen printing operation. As noted above, clamping zones are predefined to substantially conform to the footprint of the workpiece(s) to be supported, within positioning tolerances. In alternative embodiments, more or fewer clamping zones may be provided. In alternative embodiments, the clamping zones could be arranged in various ways, e.g. if there are four clamping zones provided, these could be arranged linearly in a 4×1 array, or possibly in a 2×2 array. The clamping zones need not all be the same size or shape, for example four clamping zones could be arranged in a first 3×1 array and a second adjacent 1×1 array, of larger size. The spatial minimum separation between adjacent clamping zones is determined by the applicable tolerances in placing the workpieces onto the support surface and their subsequent pick-up, while the maximum separation is reduced as far as possible to as to maximise the number of workpieces that may be supported.

In this embodiment each clamping zone 25a, b is generally rectangular in shape, but in other embodiments could be of other shape.

In this embodiment each clamping zone 25a, b comprises a plurality of recesses 30 in the form of elongate, linear channels, laterally extending parallel to the plane of the support surface 7. Each recess 30 has an inner region 31 which has a first width (i.e. in the plane of the support surface) $w_1$, and first and second outer regions 33 respectively located at opposing distal ends of the inner region 31, and which are therefore fluidly connected thereto, the outer regions 33 having a second width $w_2$ which is narrower than the first width $w_1$. The inner regions 31 are located at a central portion within the respective clamping zone 25a, 25b, while the outer regions 33, while still being located within the clamping zone, are located proximate opposing edges of the periphery of the clamping zone, such that in use the outer edge areas of a workpiece would substantially overlie the outer regions 33.

With this configuration, the inner regions 31 within the central portion define an inner area which in use experiences a first vacuum/pressure, while the outer regions 33 define an outer, peripheral area experiencing a greater vacuum/lower pressure than the first, which promotes the clamping of the one or more workpieces WP on the support surface 7 for processing, and so promotes planarity of the one or more workpieces WP. By providing a plurality of separate outer regions 33, the pressure/vacuum at this outer, peripheral region is rendered quite uniform, again promoting the planarity of the one or more workpieces WP.

In this embodiment the recesses are disposed in spaced parallel relation.

In this embodiment, respective inner regions 31 of the recesses 30 comprise through-bores 34 which extend through the support member 5 to the internal cavity 2 in a direction orthogonal to the plane of the support surface 7. This can most clearly be seen in FIG. 3, in which the port 21 may be seen through the recess inner regions 31. The inner regions 31 have substantially the same open area at their upper and lower openings.

In this embodiment, respective outer regions of the recesses 30 are closed, such that they do not extend to the internal cavity 2 in a direction orthogonal to the plane of the support surface 7. This can most clearly be seen in FIG. 5, which shows the outer regions 33 being closed at their lowest point, in contrast to the inner regions 31 being open.

In this embodiment the width $w_1$ of the inner regions 31 is from approximately 2 mm to approximately 5 mm.

In this embodiment the width $w_2$ of the outer regions 33 is from approximately 0.5 mm to approximately 1 mm at the support surface 7.

In this embodiment the or each outer region has a cross-sectional area of from approximately 0.25 mm$^2$ to approximately 2 mm$^2$, optionally from 0.5 mm$^2$ to 1.5 mm$^2$.

In this embodiment each clamping zone 25a, b further comprises at least one manifold 41, here a substantially rectangular (though with rounded corners), annular manifold, which fluidly connects the outer regions 33 in parallel. Manifold 41 is in the form of a closed-bottom channel formed in the support surface 7, which lies inside and proximate the periphery of the respective clamping zone.

Figure 10:
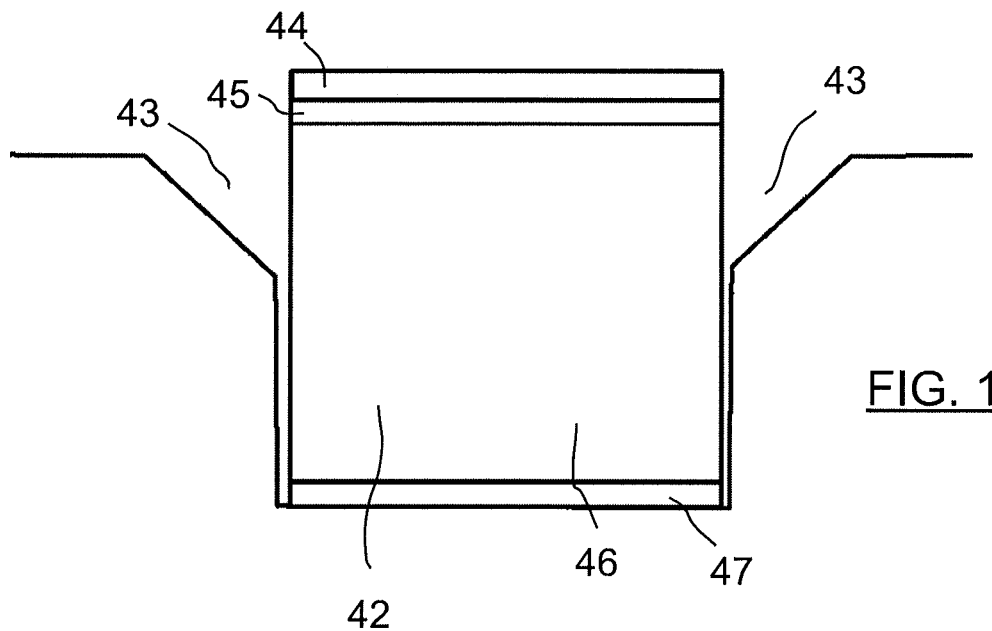
FIG. 10 schematically shows an enlarged sectional view of the gasket arrangement of the tooling support of FIG. 8.
Figure 11:
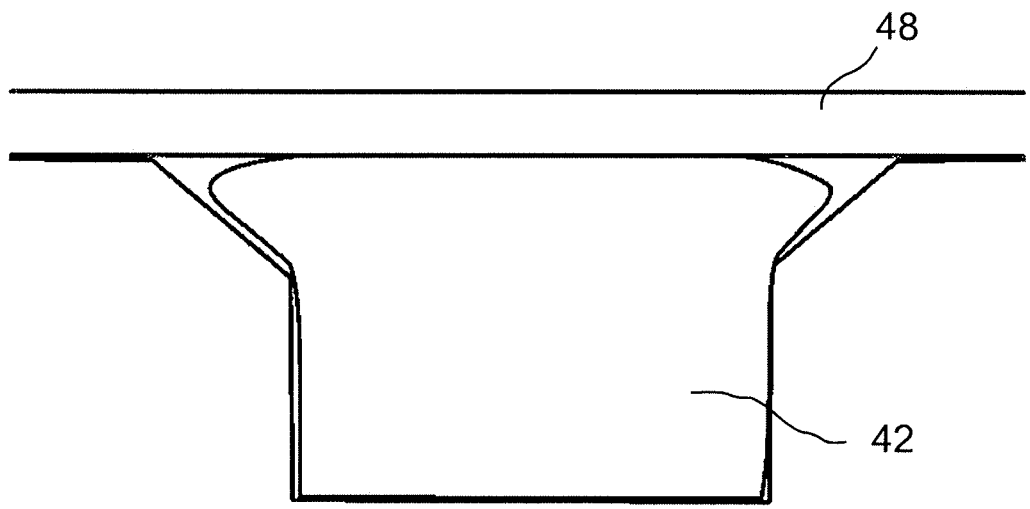
FIG. 11 schematically shows a view similar to that of FIG. 10, with a workpiece being supported.

A further embodiment of the present invention is schematically shown in FIGS. 8 to 11. This embodiment shares many of the features of the previously-described embodiment, and reference numerals are retained where possible. In this embodiment, a resiliently-deformable gasket 42 is provided around each clamping zone, located in a closed-bottomed channel formed in the support surface 7. The gasket 42 provides a pressure barrier, such that the region internal of the gasket may be kept at a lower pressure in use than the surrounding area, which would generally be at atmospheric pressure. It should be noted that in this embodiment, no manifold functionality is provided. In the embodiment shown in FIGS. 8 to 11, a modified form of channel is used, which includes flared gaps 43 proximate the top of the channel. This is shown most clearly in the enlarged sectional views of FIGS. 10 and 11. The gasket 42 may for example have a width in the range of approximately 1 to 3 mm and a height in the range of approximately 1 to 4 mm. FIG. 10 schematically shows a sectional view of the gasket 42 arrangement of the tooling support in its unused position, i.e. while no substrate or workpiece is supported thereon. The gasket 42 is formed as a layered structure. The upper surface, which in use contacts the underside of a substrate or workpiece, is a protective shielding layer 44, which acts to protect the gasket from damage during use. Suitable materials for layer 44 include rubber or polyurethane for example, in a layer thickness of approximately 200 μm to approximately 4 mm. This layer 44 is preferably non-tacky to reduce the risk of unwanted adherence of the gasket to the substrate 48, to avoid damage to the gasket upon removal of the substrate. In alternative embodiments layer 44 could be tacky to provide greater adherence if required, for example if the applied vacuum is insufficient by itself to safely constraint the workpiece. This is bonded via a first bonding layer 45 of suitable adhesive to a compressive, resiliently deformable layer 46, which forms the bulk of the gasket 42. In this embodiment, layer 46 is formed of closed-cell silicon foam. Suitable thicknesses are between approximately 0.5 mm to approximately 3.5 mm. The layer 46 is in turn bonded to the base of the channel via a second bonding layer 47 of suitable adhesive. A variety of commercially available adhesives may be used for layers 45 and 47, as will be appreciated by those skilled in the art. FIG. 11 shows a similar view to FIG. 10, but with the tooling in use, such that a substrate 48 is held to the upper surface of the support surface 7. It can be seen that the compressive layer 46 of the gasket 42 is squashed down and bulges out into the gaps 43. The gasket 42 can thereby conform to the substrate 48 to form a close interface, so that substantially no air can pass therebetween.

In other embodiments (not shown), rather than using a custom channel for the gasket 42, it may instead be conveniently located within the closed-bottom channel which, in the first-described embodiment (see FIG. 3 for example), defined the manifold 41.

In further embodiments (not shown), a manifold structure, similar to that of the first-described embodiment, may be retained, and an additional channel and gasket provided around the outside periphery of the manifold.

In yet further embodiments (not shown), a single gasket may be used to surround a plurality of clamping zones.

In all cases, the choice of gasket provision and arrangement will depend upon the specific application.

Finally, it will be understood that the present invention has been described in its preferred embodiments and can be modified in many different ways without departing from the scope of the invention as defined by the appended claims. Other possibilities and alternatives within the scope of the invention will be apparent to those skilled in the art. In particular, it is to be understood that the form of support member/tooling support will be configured, within the scope of the invention, based on the particular form of workpiece to be supported, including its size, shape and flexibility. For example, while the recesses shown in FIGS. 1 to 9 have substantially constant width along the inner regions and along the outer regions, the width need not be constant. As specific examples, the recesses may be formed as rhomboids or lozenges with a wider middle section than end section, or indeed any shape, e.g. ellipse, mandorla etc, whereby the inner region has a greater width at all points thereof than the outer section(s). Furthermore, the recesses need not be axially aligned to the edges of the clamping zones, but could be angled thereto. In this latter case, the lengths of adjacent recesses could vary. In yet further alternative embodiments, the recesses need not be linear, but could bend, curve or include angled sections. Furthermore, while regularly spaced recesses are beneficial, for some applications irregularly spaced recesses may be used. In a yet further embodiment, a plurality of relatively narrow outer regions could extend or radiate outwardly from a common inner region of relatively great width (i.e. diameter).

While the embodiment described above includes an annular manifold arranged to lie inside and proximate the periphery of respective clamping zones, this manifold helping to equalise pressure around the clamping zone periphery, such a manifold is not strictly necessary, and may be omitted in alternative embodiments.

In alternative embodiments, the vacuum port 21 need not be located at the base member 19 of body 3, but could be located on the side of main body member 15 for example.

The gasket 42 may take various forms, for example the entire gasket may be formed from, for example, rubber or polyurethane.

The invention claimed is:

1. A support member for supporting flexible workpieces, the support member comprising: a substantially planar support surface having a plurality of co-planar clamping zones to which one of the workpieces is securable by a reduced pressure or vacuum in use, an internal cavity formed within the support member, a port for connection to a low pressure or vacuum source, the port being in fluid connection with the internal cavity, at least one recess formed in the support surface in fluid connection with the internal cavity, said at least one recess laterally extending along the support surface such that the recess has an outer region located proximate a periphery of the clamping zone and an inner region located within a central portion of the clamping zone, the inner and outer regions having respective widths, (w1) and (w2), parallel to the plane of the support surface, wherein the width (w2) of the outer region of the at least one recess is narrower than the width (w1) of the inner region, such that in use, when the port is fluidly connected to a low pressure or vacuum source, pressure at the periphery of the clamping zone is lower than at the central portion within the clamping zone, and wherein the outer region of the at least one recess is closed, such that it does not extend to the internal cavity in a direction orthogonal to the plane of the support surface; each said clamping zone including the at least one said recess laterally extending along the support surface such that the at least one said recess has an outer region located proximate the periphery of the respective clamping zone and an inner region located within the central portion of the respective clamping zone, the inner and outer regions having respective said widths parallel to the plane of the support surface, the widths of the outer regions of the respective recesses being narrower than the widths of the inner regions of the respective recesses; wherein each said clamping zone further comprises at least one manifold which fluidly connects the outer regions of the at least one recess in parallel; and wherein each said clamping zone comprises an annular manifold.

2. The support member of claim 1, wherein said at least one recess comprises a plurality of recesses.

3. The support member of claim 1, wherein the respective inner regions of the at least one recess comprise throughbores which extend through the support member to the internal cavity in a direction orthogonal to the plane of the support surface.

4. The support member of claim 1, wherein the at least one recess comprises first and second outer regions, the first and second outer regions being located at opposing distal ends of the inner region.

5. The support member of claim 4, wherein the first and second outer regions are located proximate opposing edges of the periphery of the respective clamping zone.

6. The support member of claim 4, wherein the at least one recess comprises an elongate channel, optionally an elongate linear channel.

7. The support member of claim 6, wherein the elongate channel comprises the elongate linear channel which is disposed in spaced parallel relation to another elongate linear channel.

8. The support member of claim 1, wherein the width (w1) of the inner region is from 2 mm to 5 mm.

9. The support member of claim 1, wherein the width (w2) of the outer region is from 0.5 mm to 1 mm at the support surface.

10. The support member of claim 1, wherein the outer region has a cross-sectional area of from 0.25 mm2 to 2 mm2, optionally from 0.5 mm2 to 1.5 mm2.

11. The support member of claim 1, comprising a resiliently deformable gasket surrounding each said clamping zone.

12. A tooling support for supporting the flexible workpieces, comprising the support member according to claim 1.

13. The tooling support of claim 12, comprising a body to which the support member is attached or integrally formed therewith, wherein the body includes a chamber which is fluidly connected to the internal cavity of the support member.

14. The tooling support of claim 13, wherein the body and the support member are formed as separate parts.

15. The tooling support of claim 13, wherein the body comprises a main body member with internal walls which in part define the chamber, and a base member which is coupled to the main body member and includes a port which is fluidly connected to the chamber and to which the low pressure or vacuum source is selectively applied during use.

16. The support member of claim 1, wherein the workpiece comprises a flexible electronics substrate or a flexible strip.

17. The tooling support of claim 12, wherein the workpiece comprises a flexible electronics substrate or a flexible strip.

\* \* \* \* \*